United States Patent
Kwak et al.

(10) Patent No.: US 7,193,878 B2
(45) Date of Patent: Mar. 20, 2007

(54) SEMICONDUCTOR MEMORY DEVICE LAYOUT INCLUDING INCREASED LENGTH CONNECTION LINES

(75) Inventors: Pan Suk Kwak, Kyeonggi-do (KR); Dae Seok Byeon, Kyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/452,798

(22) Filed: Jun. 14, 2006

(65) Prior Publication Data
US 2006/0285376 A1 Dec. 21, 2006

(30) Foreign Application Priority Data
Jun. 14, 2005 (KR) .................. 10-2005-0050742

(51) Int. Cl.
G11C 5/06 (2006.01)
G11C 11/34 (2006.01)

(52) U.S. Cl. ............... 365/63; 365/185.12; 365/185.13

(58) Field of Classification Search .................. 365/63, 365/185.12, 185.13, 185.25, 185.02
See application file for complete search history.

(56) References Cited

U.S. PATENT DOCUMENTS 5,748,531 A * 5/1998 Choi ..................... 365/185.18
6,556,508 B2 * 4/2003 Tsao et al. ............... 365/238.5
6,956,767 B2 * 10/2005 Kang ......................... 365/175

FOREIGN PATENT DOCUMENTS

KR 100172422 B1 10/1998
KR 1020030024223 A 3/2003

* cited by examiner

Primary Examiner—Tarifur Chowdhury
Assistant Examiner—Paul E. Patton
(74) Attorney, Agent, or Firm—Myers Bigel Sibley & Sajovec, PA (57) ABSTRACT

An integrated circuit memory device includes a memory cell array including first and second bit lines that extend side-by-side, a plurality of page buffers, a first isolation device electrically coupled to an end of the first bit line, and a second isolation device electrically coupled to an end of the second bit line. The second isolation device is arranged farther from the plurality of page buffers than the first isolation device. A first connection line is electrically coupled at a first end thereof to the first isolation device, and is electrically coupled at a second end thereof to one of the plurality of page buffers. A second connection line is electrically coupled at a first end thereof to the second isolation device, and is electrically coupled at a second end thereof to a farther one of the plurality of page buffers. The second connection line is arranged immediately adjacent to the first bit line.

18 Claims, 4 Drawing Sheets

FIG. 4

SEMICONDUCTOR MEMORY DEVICE LAYOUT INCLUDING INCREASED LENGTH CONNECTION LINES

CROSS-REFERENCE TO RELATED APPLICATION

This application claims priority under 35 U.S.C. §119 from Korean Patent Application No. 10-2005-50742, filed on Jun. 14, 2005, in the Korean Intellectual Property Office, the disclosure of which is hereby incorporated by reference herein in its entirety.

FIELD OF THE INVENTION

The present invention relates to semiconductor memory devices, and, more particularly, to layout of semiconductor memory devices.

BACKGROUND OF THE INVENTION

Generally, non-volatile semiconductor memory devices may include page buffers. The page buffers may latch data input/output to/from selected memory cells. The page buffers may be electrically connected to corresponding memory cells through conductive lines/connection nodes and bit lines.

Figure 1:
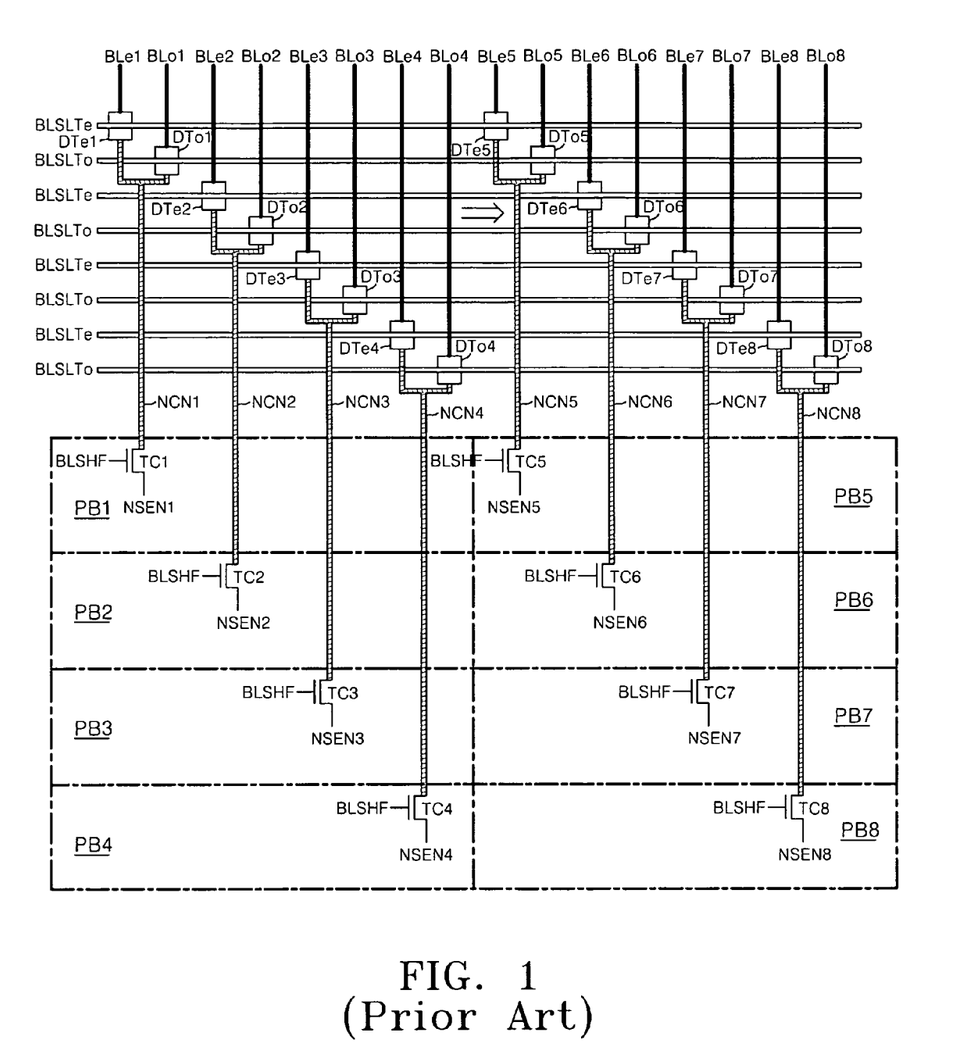
FIG. 1 is a schematic diagram illustrating the layout of a conventional non-volatile semiconductor memory device.

FIG. 1 is a schematic diagram illustrating the layout of a conventional non-volatile semiconductor memory device. As shown in FIG. 1, page buffers PB1 to PB8 are arranged in groups of four. FIG. 1 shows that respective page buffers PB1 to PB4 and PB5 to PB8 include shielding devices TC1 to TC4 and TC5 to TC8. The shielding devices TC1 to TC4 and TC5 to TC8 may be selectively activated to respectively control the connections between the sensing terminals/sense amplifiers NSEN1 to NSEN4 and NSEN5 to NSEN8 and the connection nodes NCN1 to NCN4 and NCN5 to NCN8 of the page buffers PB1 to PB4 and PB5 to PB8. The connections between the connection nodes NCN1 to NCN4 and NCN5 to NCN8 and bit lines BLe1/BLo1 to BLe4/BLo4 and BLe5/BLo5 to BLe8/BLo8 (respectively corresponding to page buffers PB1 to PB4 and PB5 to PB8), are respectively controlled by isolation devices DTe1/DTo1 to DTe4/DTo4 and DTe5/DTo5 to DTe8/DTo8. For example, the bit line BLo4 of the page buffer PB4 is arranged to be adjacent to the connection node/connection line NCN5 of the page buffer PB5.

The capacitance of each bit line may be somewhat higher than the capacitance of each connection node. Therefore, during operation of the non-volatile semiconductor memory device (in particular, during an erase operation in which the voltage of the bit line may increase to a voltage level of about 20V), the voltage of a connection node adjacent to the bit line may also increase, due to capacitive coupling between the two. However, if the voltage of a connection node so coupled with a bit line increases to a relatively high voltage, a shielding device connected to the connection node (which may have a relatively low breakdown voltage) may be damaged. Therefore, in the layout of a non-volatile semiconductor memory device, preventing the voltage of a connection node adjacent to a bit line from increasing to such a high voltage level may be an important consideration.

However, as shown in the layout of FIG. 1, the connection node NCN5 has a relatively short length because it is connected to page buffer PB5, which is located in an uppermost position. Accordingly, the capacitance of the connection node NCN5 may be relatively low in comparison to the capacitance of the adjacent bit line Blo4. Therefore, when an erase voltage is applied to the bit line BLo4 during an erase operation, the voltage of the connection node NCN5 may be increased to a relatively high voltage due to the capacitive coupling between the two. As a result, the shielding device TC5 connected to the conductive line NCN5 may be damaged and/or destroyed.

SUMMARY OF THE INVENTION

Accordingly, some embodiments of the present invention provide a layout of a non-volatile semiconductor memory device including first and second layout groups that are arranged to be adjacent to each other in a lateral direction. Each of the first and second layout groups may include a plurality of page buffers stacked and arranged in a vertical direction; a plurality of isolation devices corresponding to the page buffers, the isolation devices being arranged above the page buffers and arranged at sequentially varying distances to a specific page buffer, a plurality of connection nodes for connecting the page buffers and corresponding isolation devices; and a plurality of bit lines connected to respective isolation devices, the bit lines extending in a direction opposite the respective connection nodes. A connection node corresponding to an isolation device placed farthest away from the specific page buffer may be connected to a page buffer arranged in a lowermost position.

In other embodiments, a layout of a non-volatile semiconductor memory device may include first and second page buffers stacked and arranged in a vertical direction; first and second isolation devices corresponding to the first and second page buffers, the first and second isolation devices being arranged above the page buffers and arranged at different distances to the second page buffer, first and second connection nodes connecting the page buffers and corresponding isolation devices; and first and second bit lines connected to respective isolation devices while extending in a direction opposite the respective connection nodes. The first isolation device may be located above the second isolation device, and the first page buffer may be located below the second page buffer.

According to further embodiments of the present invention, an integrated circuit memory device includes a memory cell array including first and second bit lines that extend side-by-side, a plurality of page buffers, a first isolation device electrically coupled to an end of the first bit line, and a second isolation device electrically coupled to an end of the second bit line. The second isolation device is arranged farther from the plurality of page buffers than the first isolation device. A first connection line is electrically coupled at a first end thereof to the first isolation device, and is electrically coupled at a second end thereof to one of the plurality of page buffers. A second connection line is electrically coupled at a first end thereof to the second isolation device, and is electrically coupled at a second end thereof to a farther one of the plurality of page buffers. The second connection line is arranged immediately adjacent to the first bit line.

In some embodiments, the memory device may further include a first plurality of bit lines extending side-by-side across a first portion of the memory cell array, and a second plurality of bit lines extending side-by-side across a second portion of the memory cell array. The second plurality of bit lines may be arranged immediately adjacent to the first plurality of bit lines. The first bit line may be an outermost one of the first plurality of bit lines, and the second bit line may be an outermost one of the second plurality of bit lines.

In other embodiments, the memory device may further include a first plurality of isolation devices electrically coupled to ends of corresponding ones of the first plurality of bit lines, and a second plurality of isolation devices electrically coupled to ends of corresponding ones of the second plurality of bit lines. The first isolation device may be a closest one of the first plurality of isolation devices to the page buffer array, and the second isolation device may be a farthest one of the second plurality of isolation devices to the page buffer array. The first connection line may electrically couple the first isolation device to a closest one of the plurality of page buffers, and the second connection line may electrically couple the second isolation device to a farthest one of the plurality of page buffers.

In some embodiments, adjacent ones of the first and second plurality of isolation devices may be arranged at sequentially decreasing distances from the page buffer array from left to right. The memory device may further include a first plurality of connection lines of sequentially decreasing length from left to right electrically connecting corresponding ones of the first plurality of isolation devices to corresponding ones of the plurality of page buffers, and a second plurality of connection lines of sequentially decreasing length from left to right electrically connecting corresponding ones of the second plurality of isolation devices to corresponding ones of the plurality of page buffers. The first connection line may be a shortest one of the first plurality of connection lines, and the second connection line may be a longest one of the second plurality of connection lines.

In other embodiments, adjacent ones of the first and second plurality of isolation devices may be arranged at sequentially increasing distances from the page buffer array from left to right. The memory device may further include a first plurality of connection lines of sequentially increasing length from left to right electrically connecting corresponding ones of the first plurality of isolation devices to corresponding ones of the plurality of page buffers, and a second plurality of connection lines of sequentially increasing length from left to right electrically connecting corresponding ones of the second plurality of isolation devices to corresponding ones of the plurality of page buffers. The first connection line may be a shortest one of the first plurality of connection lines, and the second connection line may be a longest one of the second plurality of connection lines.

In some embodiments, the memory device may also include a third bit line extending side-by-side the first bit line opposite the second bit line, and a fourth bit line extending side-by-side the second bit line opposite the first bit line. A third isolation device may be electrically coupled to an end of the third bit line and may be electrically coupled to the first end of the first connection line. A fourth isolation device may be electrically coupled to an end of the fourth bit line and may be electrically coupled to the first end of the second connection line.

In other embodiments, the memory device may include a first shielding device electrically connected between the second end of the first connection line and the one of the plurality of page buffers, and a second shielding device electrically connected between the second end of the second connection line and the farther one of the plurality of page buffers. The first shielding device may be configured to electrically isolate the first connection line responsive to a signal applied thereto, and the second shielding device may be configured to electrically isolate the second connection line responsive to a signal applied thereto.

According to still further embodiments of the present invention, an integrated circuit memory device includes an array of memory cells having a first plurality of bit lines that extend side-by-side across a first portion of the array and a second plurality of bit lines that extend side-by-side across a second portion of the array, a plurality of page buffers, a first plurality of isolation devices electrically coupled to ends of corresponding ones of the first plurality of bit lines, and a second plurality of isolation devices electrically coupled to ends of corresponding ones of the second plurality of bit lines. The memory device further includes a first plurality of connection lines of different length electrically coupled at first ends thereof to corresponding ones of the first plurality of isolation devices and electrically coupled at second ends thereof to corresponding ones of the plurality of page buffers, and a second plurality of connection lines of different length electrically coupled at first ends thereof to corresponding ones of the second plurality of isolation devices and electrically coupled at second ends thereof to corresponding ones of the plurality of page buffers. The first plurality of connection lines are arranged side-by-side according to length so that a shortest one of the first plurality of connection lines is on a first side of the first plurality of connection lines and a longest one of the first plurality of connection lines is on a second side of the first plurality of connection lines. The second plurality of connection lines are arranged side-by-side according to length so that a shortest one of the second plurality of connection lines is on a first side of the second plurality of connection lines, which is immediately adjacent the second side of the first plurality of connection lines, and a longest one of the second plurality of connection lines is on a second side of the second plurality of connection lines. One of the first plurality of isolation devices that is electrically coupled to the longest one of the first plurality of connection lines is arranged on the second side thereof farthest from the plurality of page buffers. One of the second plurality of isolation devices that is electrically coupled to the shortest one of the second plurality of connection lines is arranged on the first side thereof closest to the plurality of page buffers.

In some embodiments, adjacent ones of the first plurality of isolation devices may be arranged at sequentially increasing distances from the plurality of page buffers from the first side of the first plurality of connection lines to the second side thereof. Likewise, adjacent ones of the second plurality of isolation devices may be arranged at sequentially increasing distances from the plurality of page buffers from the first side of the second plurality of connection lines to the second side thereof.

In other embodiments, adjacent ones of the first and second plurality of connection lines may be arranged side-by-side in sequentially increasing length from respective first sides to second sides thereof.

DETAILED DESCRIPTION OF EMBODIMENTS OF THE INVENTION

The present invention now will be described more fully hereinafter with reference to the accompanying drawings, in which illustrative embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "coupled", "connected" or "responsive" to another element, it can be directly coupled, connected or responsive to the other element or intervening elements may also be present. In contrast, when an element is referred to as being "directly coupled", "directly connected" or "directly responsive" to another element, there are no intervening elements present. Like numbers refer to like elements throughout. As used herein the term "and/or" includes any and all combinations of one or more of the associated listed items and may be abbreviated by "/".

It will also be understood that, although the terms first, second, etc. may be used herein to describe various elements, these elements should not be limited by these terms. These terms are only used to distinguish one element from another element. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
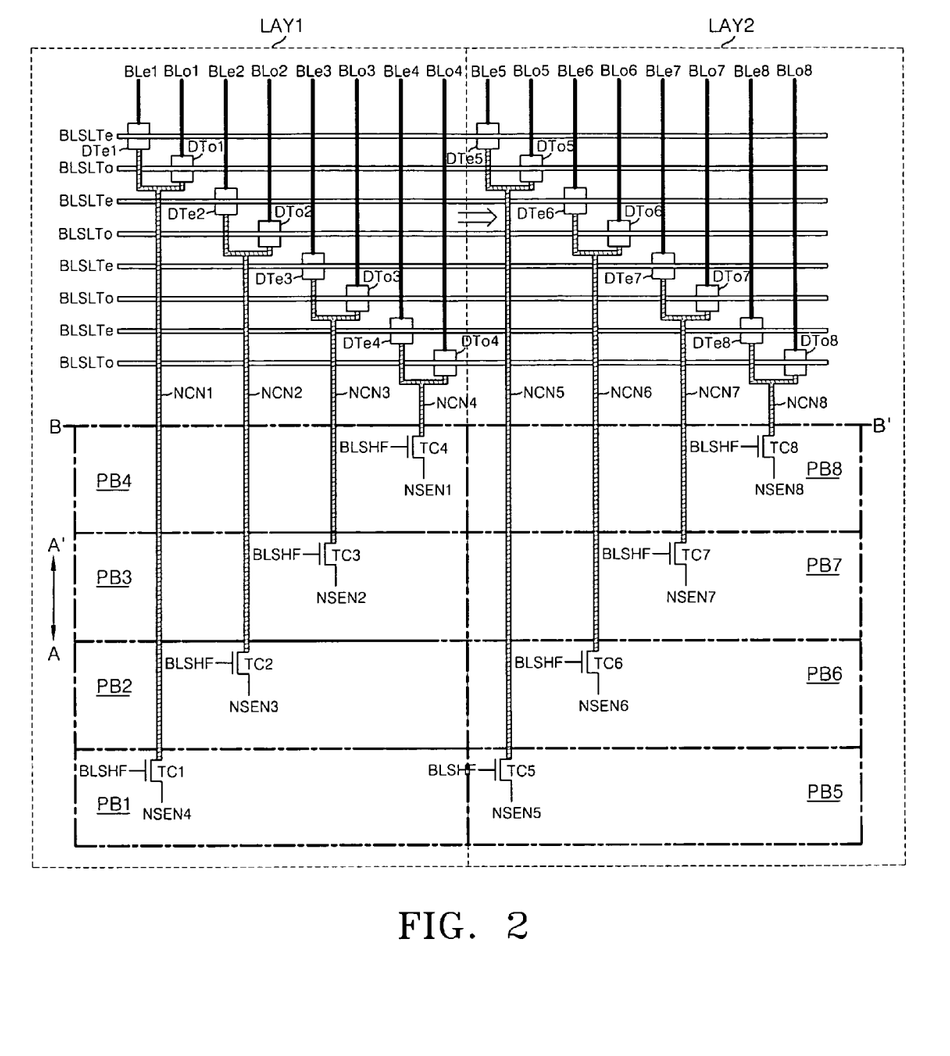
FIG. 2 is a schematic diagram illustrating a layout of a non-volatile semiconductor memory device according to some embodiments of the present invention.

FIG. 2 is a schematic diagram illustrating a layout of a non-volatile semiconductor memory device according to some embodiments of the present invention. Referring now to FIG. 2, first and second layout groups LAY1 and LAY2 are arranged beside each other, and include first and second groupings of bit lines. More specifically, the first and second layout groups LAY1 and LAY2 are arranged adjacent to each other in a lateral direction so that a last or outermost bit line of layout group LAY1 is immediately adjacent a first or outermost bit line of layout group LAY2. As used herein, the term "immediately adjacent" refers to connection lines/nodes that are arranged side-by-side, without the presence of other connection lines/nodes therebetween.

Still referring to FIG. 2, in the first layout group LAY1, four page buffers PB1 to PB4, four pairs of isolation devices DTe1/DTo1 to DTe4/DTo4 (also referred to herein as "bit line selection devices"), four connection lines/nodes NCN1 to NCN4, and four pairs of bit lines BLe1/BLo1 to BLe4/BLo4 are shown. The page buffers PB1 to PB4 are arranged along a vertical direction (A–A'), and may be operable to latch data input/output to/from corresponding selected memory cells (not shown) and to store the latched data. In FIG. 2, the page buffer PB1 is located in a lowermost position, and the page buffer PB4 is located in an uppermost position.

The four pairs of isolation devices DTe1/DTo1 to DTe4/DTo4 of the first layout group LAY1 may be arranged based on the locations of the page buffers PB1 to PB4. More particularly, the four pairs of isolation devices DTe1/DTo1 to DTe4/DTo4 are arranged at sequentially decreasing distances from the array of page buffers PB1 to PB4. In other words, in FIG. 2, the distances between the isolation devices DTe1/DTo1 to DTe4/DTo4 and a side B–B' of the closest page buffer PB4 sequentially decrease from left to right.

As shown in FIG. 2, the conductive traces/connection lines NCN1 to NCN4 connect their respective page buffers PB1 to PB4 to the isolation devices DTe1/DTo1 to DTe4/DTo4. For example, the connection node NCN1 corresponding to the isolation devices DTe1/DTo1 located farthest from the side B–B' of the page buffer PB4 is connected to the page buffer PB1 located in a farthest or lowermost position of the page buffer array. Therefore, the connection line/node NCN1 connecting the page buffer PB1 and the isolation devices DTe1/DTo1 is the longest.

Further, the four pairs of bit lines BLe1/BLo1 to BLe4/BLo4 are respectively connected to the four corresponding pairs of isolation devices DTe1/DTo1 to DTe4/DTo4, while extending in a direction opposite the connection nodes NCN1 to NCN4.

The second layout group LAY2 has an arrangement that is similar to the first layout group LAY1. As such, a detailed description of the second layout group LAY2 is omitted in the present specification.

Figure 3:
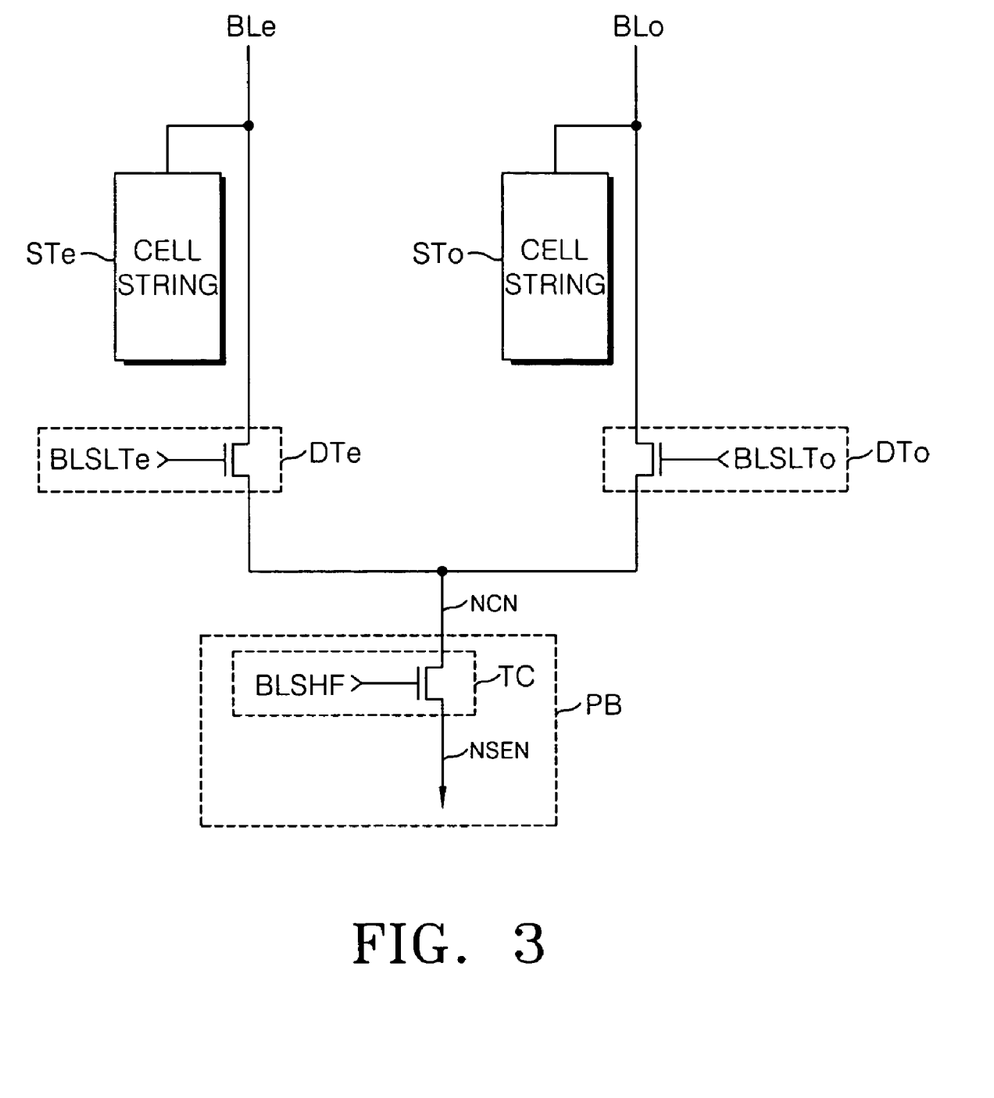
FIG. 3 is a schematic diagram illustrating components coupled to a single page buffer in a non-volatile semiconductor memory device according to some embodiments of the present invention.

FIG. 3 is a schematic diagram illustrating components coupled to a single page buffer in a layout of a non-volatile semiconductor memory device according to some embodiments of the present invention. The page buffers PB1 to PB8 of FIG. 2 may be similarly driven. Further, the isolation devices DTe1/DTo1 to DTe4/DTo4 and the bit lines BLe1/BLo1 to BLe8/BLo8 connected to the page buffers PB1 to PB8 may also be similarly driven. Although the reference designators may differ, it is to be understood that some of the components of FIG. 3 may correspond to some of the components of FIG. 2.

In FIG. 3, a page buffer PB, isolation devices DTe and DTo, and bit lines BLe and BLo are shown. Cell strings STe and STo, each including a plurality of memory cells (not shown), are respectively connected to the bit lines BLe and BLo. Therefore, the parasitic capacitances of a relatively large number of memory cells may affect the bit lines BLe and BLo, and as such, the bit lines BLe and BLo may have relatively high capacitances.

The page buffer PB latches data input/output to/from a selected memory cell. The page buffer PB is electrically connected to a memory cell selected from among the cell string STe or STo through the connection line/node NCN and the bit line BLe or BLo. The page buffer PB includes a shielding device TC. The shielding device TC controls the connection between the sensing terminal/amplifier NSEN of the page buffer PB and the connection node NCN. For example, the shielding device TC may be a MOS transistor controlled in response to a shielding control signal BLSHF.

The isolation devices DTe and DTo control the connections between the connection node NCN and the bit lines BLe and BLo, respectively. The isolation devices DTe and DTo may be MOS transistors controlled in response to bit line selection signals BLSLTe and BLSLTo, respectively.

Accordingly, during operation of a non-volatile semiconductor memory device according to some embodiments of the present invention, the connection node NCN can be electrically isolated from the bit lines BLe and BLo and/or the sensing terminal NSEN of the page buffer PB by the isolation devices DTe and DTo and/or by the shielding device TC, respectively. For example, during an erase operation, the shielding control signal BLSHF and the bit line selection signals BLSLTe and BLSLTo may be driven at a "low" (i.e., logic "0") level. As such, the shielding device TC and the isolation devices DTe and DTo may be turned off, and the connection node NCN may be floated. Accordingly, the floated connection node NCN may be capacitively coupled with an adjacent bit line, as described above with reference to the prior art.

Referring back to FIG. 2, the connection node NCN5 of the second layout group LAY2 (which is immediately adjacent to the bit line BLo4 of the first layout group LAY1) connects the isolation devices DTe5/DTo5, arranged in an uppermost position of the second layout group LAY2, and the page buffer PB5, arranged in a lowermost position. Therefore, the length of the connection node NCN5 of FIG. 2 is longer than that of the connection node NCN5 of the conventional non-volatile semiconductor memory device of FIG. 1. Accordingly, due to the increased length, the capacitance of the connection node NCN5 of FIG. 2 may also be greater than that of the connection node NCN5 of FIG. 1.

It is noted that the length of the bit line BLo4 may also increase as the length of the connection node NCN5 increases. However, as the length of the bit line BLo4 may be considerably greater than that of the connection line/node NCN5, the influence of the increase in the length of the bit line BLo4 may be relatively small.

Accordingly, in non-volatile semiconductor memory devices according to some embodiments of the present invention, the ratio of the capacitance of the connection node NCN5 to the capacitance of the bit line BLo4 may be significantly increased. As a result, the voltage at the connection node NCN5 that may result from capacitive coupling with the bit line BLo4 may be decreased.

Figure 4:
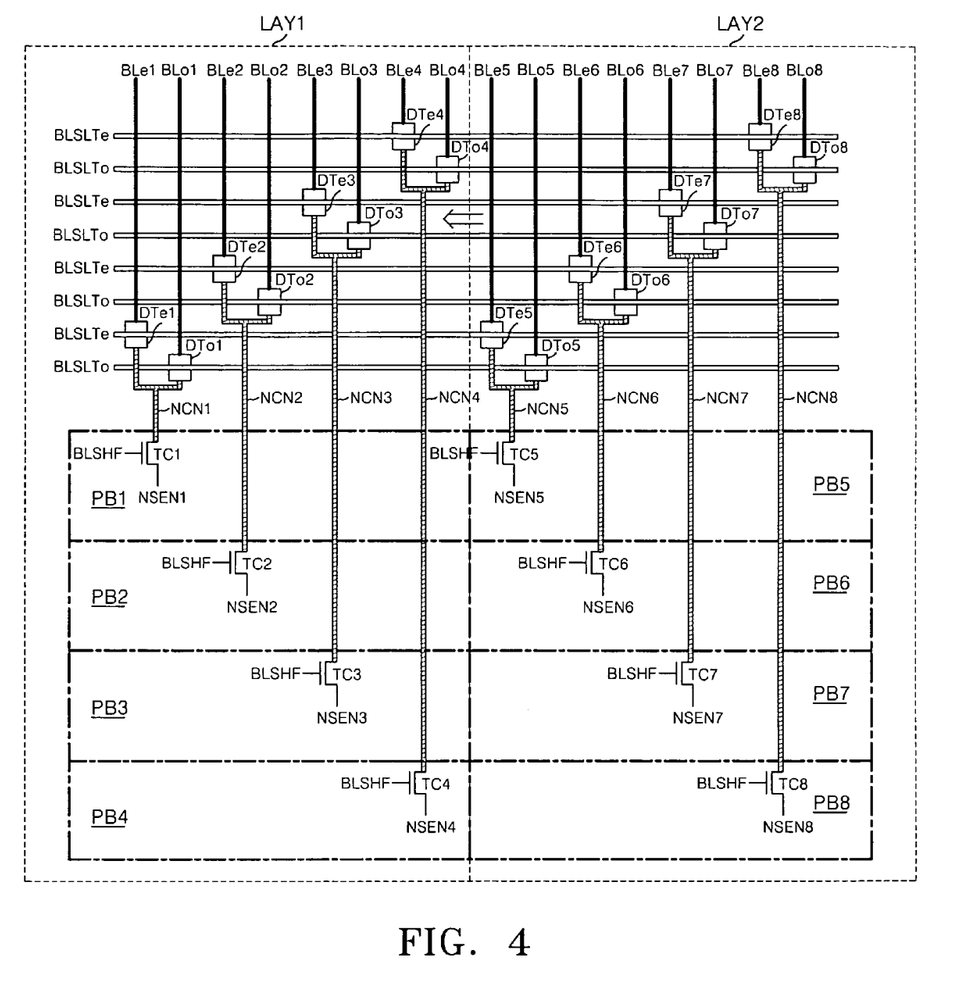
FIG. 4 is a schematic diagram illustrating a layout of a non-volatile semiconductor memory device according to further embodiments of the present invention.

FIG. 4 is a schematic diagram illustrating the layout of a non-volatile semiconductor memory device according to further embodiments of the present invention. The layout of FIG. 4 is similar to that of FIG. 2. However, the connection nodes are arranged so that their lengths sequentially decrease from left to right in FIG. 2, while the connection nodes are arranged so that their lengths sequentially increase from left to right in FIG. 4. The advantages of the layout of the non-volatile semiconductor memory device of FIG. 4 can be easily understood by those skilled in the art with reference to the layout and description of FIG. 2 provided above, and as such, a detailed description thereof is omitted in the present specification.

Therefore, in layouts of non-volatile semiconductor memory devices according to some embodiments of the present invention, a ratio of the capacitance of a connection node (which may be capacitively coupled with an adjacent bit line) to the capacitance of the adjacent bit line may be significantly increased. As such, an increase in the voltage at a connection node which may result from capacitive coupling may be mitigated. Accordingly, the risk of damaging and/or destroying a shielding device connected to the connection node may be decreased.

Although embodiments of the present invention have been disclosed for illustrative purposes, those skilled in the art will appreciate that various modifications, additions and substitutions are possible. For example, in the schematic diagram of FIG. 3 and layouts of FIGS. 2 and 4, a single page buffer is connected to two bit lines (i.e., an even bit line and an odd bit line). However, it will be apparent to those skilled in the art that the technical spirit of the present invention can be implemented in a non-volatile semiconductor memory device having a structure in which a single page buffer is connected to a single bit line.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed is:

1. A layout of a non-volatile semiconductor memory device including first and second layout groups that are arranged to be adjacent to each other in a lateral direction, wherein each of the first and second layout groups comprises:
   a plurality of page buffers stacked and arranged in a vertical direction;
   a plurality of isolation devices corresponding to the page buffers, the isolation devices being arranged above the page buffers and arranged at sequentially varying distances to a specific page buffer;
   a plurality of connection nodes connecting the page buffers and corresponding isolation devices; and
   a plurality of bit lines connected to respective isolation devices, the bit lines extending in a direction opposite the respective connection nodes,
   wherein a connection node corresponding to an isolation device located farthest away from the specific page buffer is connected to a page buffer located in a lowermost position.

2. The layout of a non-volatile semiconductor memory device according to claim 1, wherein each of the connection nodes is connected to two isolation devices and corresponds to two bit lines respectively connected to the two isolation devices.

3. The layout of a non-volatile semiconductor memory device according to claim 1, wherein each of the page buffers comprises a shielding device configured to electrically isolate a connection node corresponding to a sensing terminal of the page buffer.

4. A layout of a non-volatile semiconductor memory device, comprising:
   first and second page buffers stacked and arranged in a vertical direction;
   first and second isolation devices corresponding to the first and second page buffers, the first and second isolation devices being arranged above the page buffers and arranged at different distances to the second page buffer;
   first and second connection nodes connecting the page buffers and corresponding isolation devices; and
   first and second bit lines connected to respective isolation devices while extending in a direction opposite the respective connection nodes,
   wherein the first isolation device is located above the second isolation device, and
   wherein the first page buffer is located below the second page buffer.

5. The layout of a non-volatile semiconductor memory device according to claim 4, wherein each of the connection nodes is connected to two isolation devices and corresponds to two bit lines respectively connected to the two isolation devices.

6. The layout of a non-volatile semiconductor memory device according to claim 4, wherein each of the first and second page buffers comprises a shielding device configured to electrically isolate a connection node corresponding to a sensing terminal of the page buffer.

7. An integrated circuit memory device, comprising:
   a memory cell array including first and second bit lines that extend side-by-side;
   a plurality of page buffers;
   a first isolation device electrically coupled to an end of the first bit line;
   a second isolation device electrically coupled to an end of the second bit line, the second isolation device arranged farther from the plurality of page buffers than the first isolation device;
   a first connection line electrically coupled at a first end thereof to the first isolation device and electrically coupled at a second end thereof to one of the plurality of page buffers; and
   a second connection line electrically coupled at a first end thereof to the second isolation device and electrically coupled at a second end thereof to a farther one of the plurality of page buffers, the second connection line arranged immediately adjacent to the first bit line.

8. The integrated circuit memory device of claim 7, further comprising:
   a first plurality of bit lines extending side-by-side across a first portion of the memory cell array; and
   a second plurality of bit lines extending side-by-side across a second portion of the memory cell array and arranged immediately adjacent to the first plurality of bit lines,
   wherein the first bit line is an outermost one of the first plurality of bit lines, and wherein the second bit line is an outermost one of the second plurality of bit lines.

9. The integrated circuit memory device of claim 8, further comprising:
   a first plurality of isolation devices electrically coupled to ends of corresponding ones of the first plurality of bit lines, wherein the first isolation device comprises a closest one of the first plurality of isolation devices to the page buffer array, and wherein the first connection line electrically couples the first isolation device to a closest one of the plurality of page buffers; and
   a second plurality of isolation devices electrically coupled to ends of corresponding ones of the second plurality of bit lines, wherein the second isolation device comprises a farthest one of the second plurality of isolation devices to the page buffer array, and wherein the second connection line electrically couples the second isolation device to a farthest one of the plurality of page buffers.

10. The integrated circuit memory device of claim 9, wherein adjacent ones of the first and second plurality of isolation devices are arranged at sequentially decreasing distances from the page buffer array from left to right.

11. The integrated circuit memory device of claim 10, further comprising:
   a first plurality of connection lines of sequentially decreasing length from left to right electrically connecting corresponding ones of the first plurality of isolation devices to corresponding ones of the plurality of page buffers, wherein the first connection line comprises a shortest one of the first plurality of connection lines; and
   a second plurality of connection lines of sequentially decreasing length from left to right electrically connecting corresponding ones of the second plurality of isolation devices to corresponding ones of the plurality of page buffers, wherein the second connection line comprises a longest one of the second plurality of connection lines.

12. The integrated circuit memory device of claim 9, wherein adjacent ones of the first and second plurality of isolation devices are arranged at sequentially increasing distances from the page buffer array from left to right.

13. The integrated circuit memory device of claim 12, further comprising:
   a fist plurality of connection lines of sequentially increasing length from left to right electrically connecting corresponding ones of the first plurality of isolation devices to corresponding ones of the plurality of page buffers, wherein the first connection line comprises a shortest one of the fist plurality of connection lines; and
   a second plurality of connection lines of sequentially increasing length from left to right electrically connecting corresponding ones of the second plurality of isolation devices to corresponding ones of the plurality of page buffers, wherein the second connection line comprises a longest one of the second plurality of connection lines.

14. The integrated circuit memory device of claim 7, further comprising:
   a third bit line extending side-by-side the first bit line opposite the second bit line;
   a fourth bit line extending side-by-side the second bit line opposite the first bit line;
   a third isolation device electrically coupled to an end of the third bit line and electrically coupled to the first end of the first connection line; and
   a fourth isolation device electrically coupled to an end of the fourth bit line and electrically coupled to the first end of the second connection line.

15. The integrated circuit device of claim 7, further comprising:
   a first shielding device electrically connected between the second end of the first connection line and the one of the plurality of page buffers and configured to electrically isolate the first connection line responsive to a signal applied thereto; and a second shielding device electrically connected between the second end of the second connection line and the farther one of the plurality of page buffers and configured to electrically isolate the second connection line responsive to a signal applied thereto.

16. An integrated circuit memory device, comprising:

an array of memory cells having a first plurality of bit lines that extend side-by-side across a first portion of the array and a second plurality of bit lines that extend side-by-side across a second portion of the array;

a plurality of page buffers;

a first plurality of isolation devices electrically coupled to ends of corresponding ones of the first plurality of bit lines;

a second plurality of isolation devices electrically coupled to ends of corresponding ones of the second plurality of bit lines;

a first plurality of connection lines of different length electrically coupled at first ends thereof to corresponding ones of the first plurality of isolation devices and electrically coupled at second ends thereof to corresponding ones of the plurality of page buffers, the first plurality of connection lines arranged side-by-side according to length so that a shortest one of the first plurality of connection lines is on a first side of the first plurality of connection lines and a longest one of the first plurality of connection lines is on a second side of the first plurality of connection lines; and a second plurality of connection lines of different length electrically coupled at first ends thereof to corresponding ones of the second plurality of isolation devices and electrically coupled at second ends thereof to corresponding ones of the plurality of page buffers, the second plurality of connection lines arranged side-by-side according to length so that a shortest one of the second plurality of connection lines is on a first side of the second plurality of connection lines, which is immediately adjacent the second side of the first plurality of connection lines, and a longest one of the second plurality of connection lines is on a second side of the second plurality of connection lines, wherein one of the first plurality of isolation devices that is electrically coupled to the longest one of the first plurality of connection lines is arranged on the second side thereof farthest from the plurality of page buffers, and wherein one of the second plurality of isolation devices that is electrically coupled to the shortest one of the second plurality of connection lines is arranged on the first side thereof closest to the plurality of page buffers.

17. The integrated circuit memory device of claim 16, wherein adjacent ones of the first plurality of isolation devices are arranged at sequentially increasing distances from the plurality of page buffers from the first side of the first plurality of connection lines to the second side thereof, and wherein adjacent ones of the second plurality of isolation devices are arranged at sequentially increasing distances from the plurality of page buffers from the first side of the second plurality of connection lines to the second side thereof.

18. The integrated circuit memory device of claim 17, wherein adjacent ones of the first and second plurality of connection lines are arranged side-by-side in sequentially increasing length from respective first sides to second sides thereof.

* * * * *

UNITED STATES PATENT AND TRADEMARK OFFICE
CERTIFICATE OF CORRECTION

| | | |
|---|---|---|
| PATENT NO. | : 7,193,878 B2 | Page 1 of 1 |
| APPLICATION NO. | : 11/452798 | |
| DATED | : March 20, 2007 | |
| INVENTOR(S) | : Kwak et al. | |

It is certified that error appears in the above-identified patent and that said Letters Patent is hereby corrected as shown below:

In the Claims,

Claim 13, Column 10, Line 40: Please correct "shortest one of the fist"
To read --shortest one of the first--

Signed and Sealed this

Twenty-sixth Day of June, 2007

JON W. DUDAS
*Director of the United States Patent and Trademark Office*